United States Patent
Hanazawa et al.

(10) Patent No.: US 8,143,924 B2
(45) Date of Patent: Mar. 27, 2012

(54) SEMICONDUCTOR INTEGRATED CIRCUIT DEVICE HAVING PULSE GENERATING CIRCUITS

(75) Inventors: Satoshi Hanazawa, Hamura (JP); Toshio Shinomiya, Ome (JP); Hiroyasu Yoshizawa, Hamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/685,024

(22) Filed: Jan. 11, 2010

(65) Prior Publication Data

US 2010/0214006 A1  Aug. 26, 2010

(30) Foreign Application Priority Data

Feb. 20, 2009  (JP) ................................. 2009-037338

(51) Int. Cl.
*H03K 3/00* (2006.01)
(52) U.S. Cl. ............................ 327/108; 327/112; 326/87
(58) Field of Classification Search .................... 326/87; 327/108–112

See application file for complete search history.

(56) References Cited

U.S. PATENT DOCUMENTS

| | | | |
|---|---|---|---|
| 5,632,019 A * | 5/1997 | Masiewicz | 713/300 |
| 5,903,181 A * | 5/1999 | Mori | 327/389 |
| 6,822,502 B2 * | 11/2004 | Soda | 327/308 |
| 2008/0238532 A1 | 10/2008 | Hanazawa et al. | |
| 2009/0058500 A1 | 3/2009 | Osawa et al. | |

FOREIGN PATENT DOCUMENTS

| | | |
|---|---|---|
| JP | 09-234202 A | 9/1997 |
| JP | 2008-252436 A | 10/2008 |
| KR | 2008-0063142 A | 7/2008 |

OTHER PUBLICATIONS

Supertex Inc., HV732, "High Speed ±100V 2A Integrated Ultrasound Pulser", Data Sheet.
Korean Office Action issued Jun. 21, 2011, in Korean App. No. 10-2010-1274.

* cited by examiner

*Primary Examiner* — Kenneth B. Wells
(74) *Attorney, Agent, or Firm* — Miles & Stockbridge P.C.

(57) ABSTRACT

There is provided a circuit whose output is free from high impedance to improve wrong transmission and waveform overshoot, realizing a semiconductor integrated circuit device in which plural channels is integrated with transmitter circuit as unit channel, in the transmitter circuit used in a medical ultrasound system and drives a transducer by voltage pulses having plural positive and negative electric potentials including ground potential. The transmitter circuit includes a conventional pulse generating circuit supplied with positive and negative voltage largest in absolute value, a P-channel analog switching pulse generating circuit supplied with positive voltage being the second largest therein, an N-channel analog switching pulse generating circuit supplied with negative voltage being the second largest, and an N-channel analog switching ground level damping circuit supplied with ground potential. The circuits are connected to output terminal. Switch control signals drive ultrasound transducers by turning on and off the circuits.

10 Claims, 13 Drawing Sheets

SEMICONDUCTOR INTEGRATED CIRCUIT DEVICE HAVING PULSE GENERATING CIRCUITS

CLAIM OF PRIORITY

The present application claims priority from Japanese patent application JP 2009-037338 filed on Feb. 20, 2009, the content of which is hereby incorporated by reference into this application.

FIELD OF THE INVENTION

The present invention relates to a semiconductor integrated circuit device having high-voltage high-speed power switching circuits, and high withstand voltage high-power driver circuits and, in particular, to a semiconductor integrated circuit device in which high and low withstand voltage semiconductor devices forming transmitter circuits for a medical ultrasound system are integrated on the same substrate such as a monocrystalline silicon.

BACKGROUND OF THE INVENTION

Until now, there has been a schematic configuration of a transmitter circuit which drives a transducer by voltage pulses having plural positive and negative electric potentials including ground potential using plural electronic switching elements (refer to, JP-A-Hei09 (1997)-234202, for example).

Until now, there has been a configuration in which an output of a gate drive buffer circuit is directly connected to a gate of a MOSFET (Metal Oxide Semiconductor Field Effect Transistor) to drive a transducer, eliminating the need for an AC-coupling capacitor (refer to, JP-A-2008-252436, for example).

Until now, there has been a transmitter circuit for a medical ultrasound system using as an electronic switching element high withstand voltage CMOSFETs (Complementary MOSFETs) and high withstand voltage diodes which are semiconductor devices (refer to, HV732, DATASHEET, Supertex inc., for example).

SUMMARY OF THE INVENTION

FIG. 5 is a circuit diagram of a pulse generating apparatus in which FIG. 6 described in JP-A-Hei 09 (1997)-234202 is modified based on the unique viewpoint of the inventors prior to the present invention. As illustrated in FIG. 5, the pulse generating apparatus includes high withstand voltage CMOSFETs being semiconductor devices as the electronic switching elements, however, if an electric potential relationship between voltages is represented by VPP1>VPP2>GND>VNN2>VNN1, for example, and a turn-on signal is input to S2 or S4 to turn on an N-channel high withstand voltage MOSFET, a short occurs between VNN1 and GND or VNN2 and GND through a body diode of the N-channel high withstand voltage MOSFET controlled by S5 even when a turn-off signal is input to S5. In the following figures, the transistors and the diodes encircled denote high withstand voltage elements and those not encircled denote low withstand voltage elements.

FIG. 6A is a circuit diagram of a pulse generating apparatus in which a representative drawing described in the literature; "HV732, DATASHEET, Supertex inc." is modified based on the unique viewpoint of the inventors prior to the present invention. As illustrated in FIG. 6A, the literature, "HV732, DATASHEET, Supertex inc." discusses a transmitter circuit for a medical ultrasound system using as an electronic switching element high withstand voltage CMOSFETs and high withstand voltage diodes which are semiconductor devices. The transmitter circuit is a three-level pulser for outputting any of voltages VPP1, VNN1, or GND.

The high withstand voltage diode inserted between the drain of the MOSFET whose source is grounded and the output terminal is an indispensable component for avoiding conduction between VPP1 and GND or VNN1 and GND through a body diode of the MOSFET when S1 or S2 is turned on to produce the output voltage VPP1 or VNN1 at an output terminal OUT, which is the problem described in FIG. 5.

FIG. 6B is a timing chart for operating the circuit in FIG. 6A. In FIG. 6B, turning on S3 and S4 brings the output voltage at the output terminal OUT close to a ground electric potential. Even if S3 and S4 are kept turning on, the output voltage at the output terminal OUT ranges between −VF or higher and +VF or lower due to the existence of the high withstand voltage diode, i.e., the output has a high impedance in the range of OUT<|VF| (refer to an area X in FIG. 6B). Where, VF denotes a forward voltage of the high withstand voltage diode.

A transmitter-receiver circuit used in the medical ultrasound system is being integrated to realize both higher resolution of an image by higher channel counts and smaller size of the apparatus. Also in the transmitter circuit, a multi-channel integration has been performed by the semiconductor integrated circuit with the circuit configuration illustrated in FIG. 6A as a unit channel; however, a crosstalk between channels tends to increase due to an increase in the number of channels and a reduction in the distance between channels. A high impedance of the output at the output terminal OUT causes noise due to a crosstalk between channels to be liable to be superimposed on the output. A change in the output voltage at the output terminal OUT due to the noise is transmitted to a transducer to generate an unintended ultrasound wave, which causes a so-called wrong transmission of a first problem to be solved.

FIG. 7A is an example of a circuit configuration in which a circuit in which the sources of a P-channel and an N-channel high withstand voltage MOSFET are connected to VPP2 and VNN2 respectively is added to the circuit configuration in FIG. 6A to realize a five-level pulser. If an electric potential relationship between voltages is represented by VPP1>VPP2>GND>VNN2>VNN1, for example, it is essential to insert high withstand voltage diodes between the drains of the P-channel and N-channel high withstand voltage MOSFETs and the output terminal to avoid a conduction between the power supply and GND.

FIG. 7B is a timing chart for operating the circuit in FIG. 7A. In FIG. 7B, turning on S5 brings the output voltage at the output terminal OUT to VPP2-VF. The output voltage has a high impedance at a voltage of VPP2-VF or higher. Turning on S6 leads to the same as the above. For this reason, a waveform is apt to overshoot at the time of turning on S5 or S6 (refer to an area Y in FIG. 7B). In other words, if the waveform overshoots due to the impedance of a wiring of a power supply, the overshoot cannot be suppressed. This is a second problem to be solved.

FIG. 8A is an example of a circuit configuration in which a circuit in which the sources of a P-channel and an N-channel high withstand voltage MOSFET are connected to VNN2 and VPP2 respectively is added to the circuit configuration in FIG. 7A to realize a five-level pulser. FIG. 8B is a timing chart for operating the circuit in FIG. 8A. The circuit configuration can solve the waveform overshoot of the second problem. Furthermore, the circuit configuration has the effect of realizing unconditional five-level output waveform, i.e., realizing not only the waveform the voltage polarity of which is alternately changed as illustrated in the timing chart in FIG. 7B but also a five level stepped-waveform as illustrated in the timing chart in FIG. 8B. However, the circuit configuration causes a third problem that a large number of semiconductor devices restrict a number of channel counts to be integrated. Besides, the circuit configuration in FIG. 8A still cannot improve the wrong transmission of the first problem.

The object of the present invention is to provide a circuit whose output is free from high impedance to improve the wrong transmission and the waveform overshoot that are the foregoing problems and realize a pulse generating circuit in which plural channels is integrated with the transmitter circuit as a unit channel, in the transmitter circuit which is used in a medical ultrasound system and drives a transducer by voltage pulses having plural positive and negative electric potentials including ground potential.

An example of a representative configuration according to the present invention is described below. A semiconductor integrated circuit device, according to the present invention, in which pulse generating circuits which are formed on a semiconductor substrate and configured such that each of plural different positive and negative electric potentials is connected to one terminal of plural semiconductor switching elements and the other terminals of the plural semiconductor switching elements are commonly connected to each other as an output terminal is characterized in that the pulse generating circuit generates a voltage pulse signal having plural positive and negative electric potentials including ground potential based on the control pulse signal input to the control terminal of the plural semiconductor switching elements.

According to the semiconductor integrated circuit device of the present invention, it is enabled to realize the transmitter circuit whose output is free from high impedance and which drives a transducer by voltage pulses having plural positive and negative electric potentials including ground potential using a smaller number of semiconductor devices. This allows downsizing of a pulse generating circuit used for a medical ultrasound system, for example, by integrating plural channels and upgrading a waveform quality by improving the wrong transmission and the waveform overshoot.

DETAILED DESCRIPTION OF THE PREFERRED EMBODIMENTS

Figure 1A:
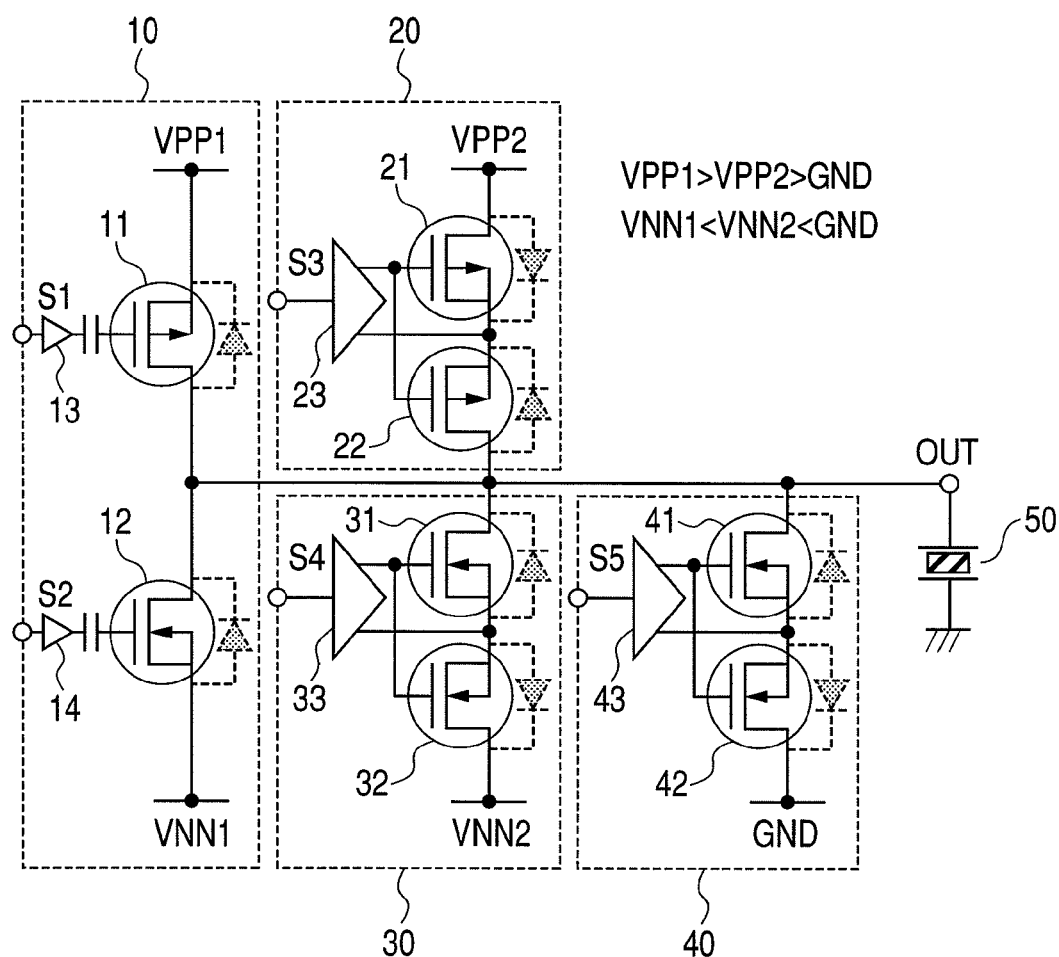
FIG. 1A is a circuit diagram of a voltage pulse generating circuit according to the present invention.

In the semiconductor integrated circuit device according to the present invention in which pulse generating circuits which are formed on a semiconductor substrate and configured such that each of plural different positive and negative electric potentials is connected to one terminal of plural semiconductor switching elements and the other terminals of the plural semiconductor switching elements are commonly connected to each other as an output terminal, the semiconductor integrated circuit device is configured such that the pulse generating circuit generates a voltage pulse signal having plural positive and negative electric potentials including ground potential based on the control pulse signal input to the control terminal of the plural semiconductor switching elements.

More specifically, the semiconductor integrated circuit device according to the present invention includes: a first P-channel high withstand voltage MOSFET whose source terminal is connected to a first positive power supply that is the largest in absolute value and drain terminal is connected to an output terminal; a first N-channel high withstand voltage MOSFET whose source terminal is connected to a first negative power supply that is the largest in absolute value and drain terminal is connected to the output terminal; a first P-channel analog switch configured such that the gate terminals of a second and third P-channel high withstand voltage MOSFETs are connected to each other, the source terminals thereof are connected to each other, the drain terminal of the second P-channel high withstand voltage MOSFET is connected to a second positive power supply, and the drain terminal of the third P-channel high withstand voltage MOSFET is connected to the output terminal; a first N-channel analog switch configured such that the gate terminals of a second and a third N-channel high withstand voltage MOSFET are connected to each other, the source terminals thereof are connected to each other, the drain terminal of the second N-channel high withstand voltage MOSFET is connected to the output terminal, and the drain terminal of the third N-channel high withstand voltage MOSFET is connected to a second negative power supply; a second N-channel analog switch configured such that the gate terminals of a fourth and a fifth N-channel high withstand voltage MOSFET are connected to each other, the source terminals thereof are connected to each other, the drain terminal of the fourth N-channel high withstand voltage MOSFET is connected to the output terminal, and the drain terminal of the fifth N-channel high withstand voltage MOSFET is grounded; and gate terminal voltage control units for the first P-channel high withstand voltage MOSFET, the first N-channel high withstand voltage MOS- FET, the first P-channel analog switch, the first N-channel analog switch, and the second N-channel analog switch.

The above configuration enables realizing the transmitter circuit whose output is free from high impedance and which drives a transducer by voltage pulses having plural positive and negative electric potentials including ground potential using a smaller number of semiconductor devices. This allows the realization of the semiconductor integrated circuit device in which plural channels is integrated and the wrong transmission and the waveform overshoot are improved to obtain a good waveform quality and which is suited for a medical ultrasound system.

The embodiment of the present invention is described below with reference to the drawings. The circuit elements forming each circuit block in the embodiment are known high and low withstand voltage MOSFETs, diodes, resistors, and capacitors. The circuit elements are formed on a single semiconductor substrate such as monocrystalline silicon by an integrated circuit technique.

First Embodiment

FIG. 1A is a circuit diagram illustrating an embodiment of a transmitter circuit according to the present invention. The voltage pulse generating circuit is realized by a semiconductor integrated circuit device with the following characteristics. Specifically, the voltage pulse generating circuit is configured such that plural different positive voltages VPP1 to VPPk (where, k is an integer of two or more), plural different negative voltages VNN1 to VNNm (where, m is an integer of two or more), and ground voltage GND are connected to one terminal of plural semiconductor switching elements respectively and the other terminal thereof is commonly connected to the output terminal OUT. The voltage pulse generating circuit is integrally formed on a single semiconductor substrate. The voltage pulse generating circuit generates a voltage pulse signal having a waveform pattern in which plural positive and negative electric potentials including ground potential GND is combined based on the control pulse signals input to the control terminals S1 to Ss (where, is the number of the switching elements and five, for example, in FIG. 1A) of plural semiconductor switching elements and outputs the voltage pulse signal to the output terminal OUT. In FIG. 1A, for example, the semiconductor integrated circuit device of the present embodiment is formed of pulse generating circuit portions 10, 20, 30, and a GND level damping circuit portion 40 and drives a transducer 50 connected to the output terminal OUT by a voltage pulse with five electric potentials of positive voltages VPP1 and VPP2, negative voltages VNN1 and VNN2, and GND. In the present embodiment, the relationship between the electric potentials is denoted by VPP1>VPP2>GND >VNN2>VNN1 in descending order.

A pulse generating circuit portion 10 including two semiconductor switching elements forming plural semiconductor switching elements, includes the P-channel MOSFET 11 and the N-channel MOSFET 12 being semiconductor switching elements and gate drive buffer circuits 13 and 14 which drive the gate terminals thereof. More specifically, the pulse generating circuit portion 10 is configured such that the gate terminal of the P-channel MOSFET 11 is connected to the control terminal S1 through the gate drive buffer circuit 13, a first voltage (the positive voltage VPP1 in FIG. 1A, for example) that is the largest in absolute value in plural different positive voltages is applied to the source terminal of the P-channel MOSFET 11, the drain terminal of the P-channel MOSFET 11 is connected to the output terminal OUT, the gate terminal of the N-channel MOSFET 12 is connected to the control terminal S2 through the gate drive buffer circuit 14, a first voltage (the negative voltage VNN1 in FIG. 1A, for example) that is the largest in absolute value in plural different negative voltages is applied to the source terminal of the N-channel MOSFET 12, and the drain terminal of the N-channel MOSFET 12 is connected to the output terminal OUT.

A pulse generating circuit portion 20 including one semiconductor switching element forming plural semiconductor switching elements is formed of a P-channel analog switch configured such that the source terminals of a first P-channel MOSFET 21 and a second P-channel MOSFET 22 are connected to each other, the gate terminals of the first P-channel MOSFET 21 and the second P-channel MOSFET 22 are connected to each other, the drain terminal of the first P-channel MOSFET 21 is supplied with a first voltage (the positive voltage VPP2 in FIG. 1A, for example) which is any one of plural different positive and negative voltages, and the drain terminal of the second P-channel MOSFET 22 is connected to the output terminal OUT; and a gate drive buffer circuit 23 configured to drive the gate terminal of the P-channel analog switch. For example, the pulse generating circuit portion 20 is configured such that the gate terminals of the P-channel high withstand voltage MOSFETs 21 and 22 are connected to each other, the source terminals thereof are connected to each other, the drain terminal of the P-channel high withstand voltage MOSFET 21 is connected to the positive power supply VPP2, the drain terminal of the P-channel high withstand voltage MOSFET 22 is connected to the output terminal OUT, and a floating voltage low-withstand voltage gate-driving circuit portion 23 for driving the gate terminals thereof is provided. The common gate terminal is connected to a control terminal S3 through the floating voltage low-withstand voltage gate-driving circuit portion 23.

A latch circuit for applying a gate control signal to the gate terminal of the P-channel analog switch circuit 20 based on the control signal input from the control terminal S3 is suited for the floating voltage low-withstand voltage gate-driving circuit portion 23. For example, the source terminals of the first and second P-channel MOSFETs 21 and 22 are connected to a power supply on the high potential side of the latch circuit as a second floating voltage varied with the voltage of the output terminal OUT connected to the drain terminal of the second P-channel MOSFET 22. A fourth voltage which is lower by a second voltage used as a low voltage power supply whose voltage is lower than a first voltage VPP2 supplied to the drain terminal of the first P-channel MOSFET 21 is supplied to a power supply on the low potential side of the latch circuit.

The latch circuit is configured such that the fourth voltage is supplied to the source terminals of the third and fourth N-channel MOSFETs; the drain terminal of a seventh P-channel MOSFET lower in withstand voltage than any other first and second P-channel MOSFETs 21 and 22, the gate terminal of an eighth P-channel MOSFET lower in withstand voltage than any other first and second P-channel MOSFETs 21 and 22, the drain terminal of a fifth N-channel MOSFET, and the low potential side of a second inverter formed of a pair of an N-channel MOSFET lower in withstand voltage than any other first to fifth N-channel MOSFETs and a P-channel MOSFET lower in withstand voltage than any other first and second P-channel MOSFETs 21 and 22 are commonly connected to the drain terminal of the third N-channel MOSFET; the gate terminal of the seventh P-channel MOSFET, the drain terminal of the eighth P-channel MOSFET, the drain terminal of a sixth N-channel MOSFET, and the input terminal of a second inverter are commonly connected to the drain terminal of a fourth N-channel MOSFET; the gate terminals of the first and second P-channel MOSFETs 21 and 22 are commonly connected to the output terminal of the second inverter; the source terminals of the fifth and sixth N-channel MOSFETs are commonly connected to a fourth voltage through a second current source; one electrode of a third capacitor and the anode of a third zener diode are commonly connected to the gate terminal of the seventh P-channel MOSFET; the other electrode of the third capacitor and the cathode of the third zener diode are commonly connected to the source terminal of the seventh P-channel MOSFET; one electrode of a fourth capacitor and the anode of a fourth zener diode are commonly connected to the gate terminal of the eighth P-channel MOSFET; and the other electrode of the fourth capacitor and the cathode of the fourth zener diode are commonly connected to the source terminal of the eighth P-channel MOSFET.

A pulse generating circuit portion 30 including one semiconductor switching element forming plural semiconductor switching elements is formed of an N-channel analog switch configured such that the source terminals of a first N-channel MOSFET 32 and a second N-channel MOSFET 31 are connected to each other, the gate terminals of the first N-channel MOSFET 32 and the second N-channel MOSFET 31 are connected to each other, the drain terminal of the first N-channel MOSFET 32 is supplied with a first voltage (the negative voltage VNN2 in FIG. 1A, for example) which is any one of plural different positive and negative voltages, and the drain terminal of the second N-channel MOSFET 31 is connected to the output terminal OUT; and a gate drive buffer circuit 33 configured to drive the gate terminal of the N-channel analog switch. For example, the pulse generating circuit portion 30 is configured such that the gate terminals of the N-channel high withstand voltage MOSFETs 31 and 32 are connected to each other, the source terminals thereof are connected to each other, the drain terminal of the N-channel high withstand voltage MOSFET 31 is connected to the output terminal OUT, the drain terminal of the N-channel high withstand voltage MOSFET 32 is connected to the negative power supply VNN2, and a floating voltage low-withstand voltage gate-driving circuit portion 33 for driving the gate terminals thereof is provided. The common gate terminal is connected to a control terminal S4 through the floating voltage low-withstand voltage gate-driving circuit portion 33.

A pulse generating circuit portion 40 including one semiconductor switching element forming plural semiconductor switching elements is formed of an N-channel analog switch configured such that the source terminals of a first N-channel MOSFET 42 and a second N-channel MOSFET 41 are connected to each other, the gate terminals of the first N-channel MOSFET 42 and the second N-channel MOSFET 41 are connected to each other, a first voltage (the ground voltage GND in FIG. 1A, for example) which is any one of plural different voltages is supplied to the drain terminal of the first N-channel MOSFET 42, and the drain terminal of the second N-channel MOSFET 41 is connected to the output terminal OUT; and a gate drive buffer circuit 43 configured to drive the gate terminal of the N-channel analog switch. For example, the pulse generating circuit portion 40 is configured such that the gate terminals of the N-channel high withstand voltage MOSFETs 41 and 42 are connected to each other, the source terminals thereof are connected to each other, the drain terminal of the N-channel high withstand voltage MOSFET 41 is connected to the output terminal OUT, the drain terminal of the N-channel high withstand voltage MOSFET 42 is connected to the ground potential GND, and a floating voltage low-withstand voltage gate-driving circuit portion 43 for driving the gate terminals thereof is provided. The common gate terminal is connected to a control terminal S5 through the floating voltage low-withstand voltage gate-driving circuit portion 43.

A latch circuit for applying a gate control signal to the gate terminal of the N-channel analog switch circuits 30 and 40 based on the control signal input from the control terminals S4 and S5 is suited for the floating voltage low-withstand voltage gate-driving circuit portions 33 and 43. For example, the source terminals of the first N-channel MOSFETs 32 and 42 and the second N-channel MOSFETs 31 and 41 are connected to a power supply on the low potential side of the latch circuit as a first floating voltage varied with the voltage of the output terminal OUT connected to the drain terminal of the second N-channel MOSFETs 31 and 41. A third voltage which is higher by a second voltage used as a low voltage power supply whose voltage is lower than a first voltage VNN2 and GND supplied to the drain terminals of the first N-channel MOSFETs 32 and 42 respectively is supplied to a power supply on the high potential side of the latch circuit.

The latch circuit is configured such that the third voltage is supplied to the source terminals of the third and fourth P-channel MOSFETs; the drain terminal of a seventh N-channel MOSFET lower in withstand voltage than any other first and second N-channel MOSFETs 32, 42, 31, and 41, the gate terminal of an eighth N-channel MOSFET lower in withstand voltage than any other first and second N-channel MOSFETs 32, 42, 31, and 41, the drain terminal of a fifth P-channel MOSFET, and the high-potential side of a first inverter formed of a pair of a P-channel MOSFET lower in withstand voltage than any other first to fifth P-channel MOSFETs and an N-channel MOSFET lower in withstand voltage than any other first and second N-channel MOSFETs 32, 42, 31, and 41 are commonly connected to the drain terminal of the third P-channel MOSFET; the gate terminal of the seventh N-channel MOSFET, the drain terminal of the eighth N-channel MOSFET, the drain terminal of a sixth P-channel MOSFET, and the input terminal of the first inverter are commonly connected to the drain terminal of a fourth P-channel MOSFET; the gate terminals of the first and second N-channel MOSFETs are commonly connected to the output terminal of the first inverter; the source terminals of the fifth and sixth P-channel MOSFETs are commonly connected to a third voltage through a first current source; one electrode of a first capacitor and the cathode of a first zener diode are commonly connected to the gate terminal of the seventh N-channel MOSFET; the other electrode of the first capacitor and the anode of the first zener diode are commonly connected to the source terminal of the seventh N-channel MOSFET; one electrode of a second capacitor and the cathode of a second zener diode are commonly connected to the gate terminal of the eighth N-channel MOSFET; and the other electrode of the second capacitor and the anode of the second zener diode are commonly connected to the source terminal of the eighth N-channel MOSFET.

Figure 1B:
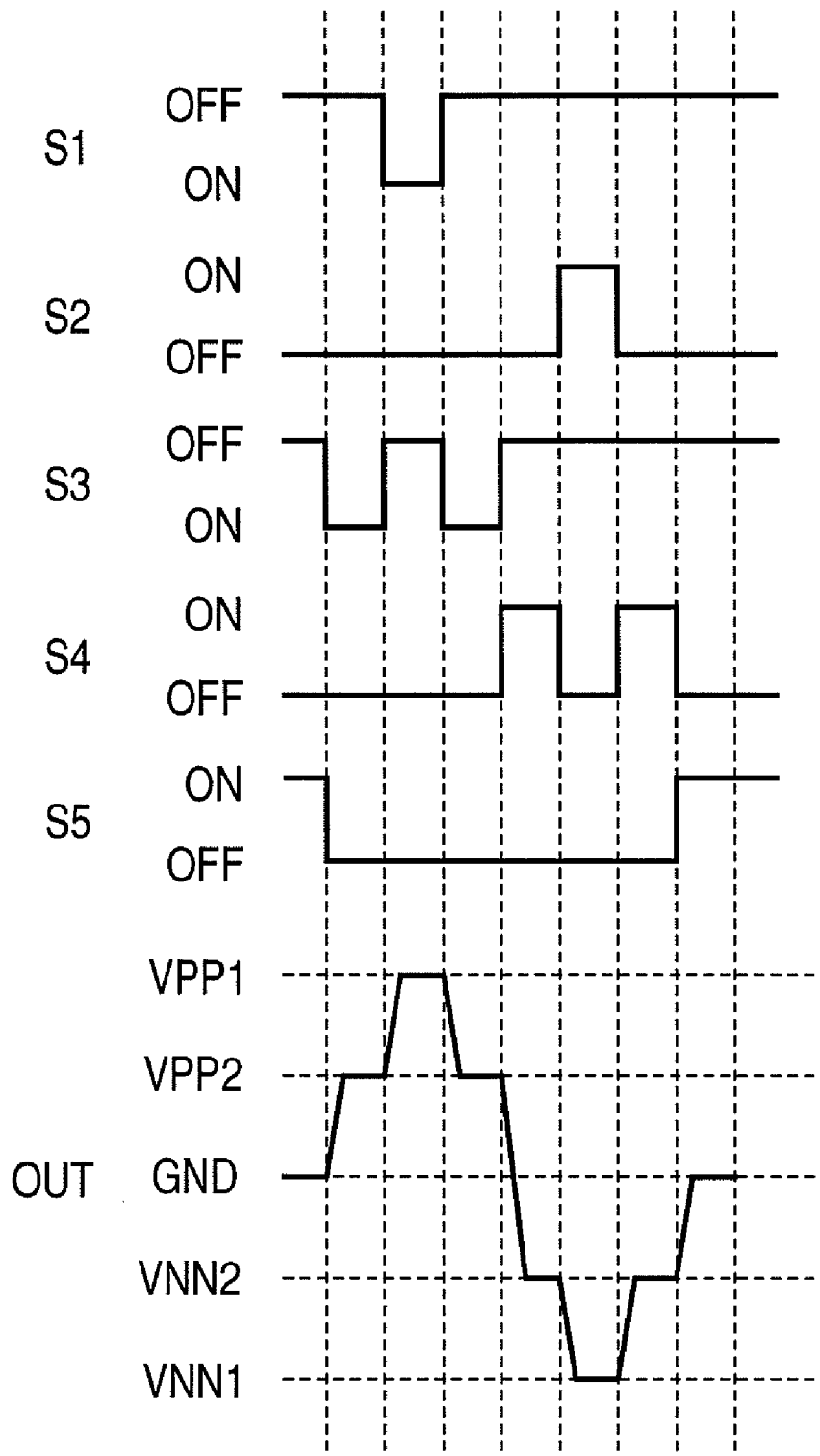
FIG. 1B is a timing chart for operating a transmitter circuit according to the present invention.

The operation of the pulse generating circuit portion 10 in FIG. 1A is described below. FIG. 1B is a timing chart for operating the circuit in FIG. 1A. As illustrated in FIG. 1B, the pulse generating circuit portion 10 has a function to generate a voltage pulse of a positive voltage VPP1 or a negative voltage VNN1 which is the largest in absolute value.

A laterally diffused MOS (LDMOS) which is high in withstand voltage between the drain and the source thereof and low in withstand voltage between the gate and the source thereof is generally used for P-channel and N-channel high withstand voltage MOSFETs 11 and 12 from the viewpoint of a reduction in the occupied area of a semiconductor substrate, an increase in operation speed, and an affinity with a low withstand voltage logic circuit. For this reason, a low withstand voltage logic input signal at the front stage drives the low withstand voltage gates of the P-channel and N-channel MOSFETs 11 and 12 through the gate drive buffer circuits 13 and 14 formed of drive buffers using low withstand voltage MOSFETs and AC coupling capacitors.

The AC coupling capacitor is an external component because the AC coupling capacitor needs a capacitance of approximately 10 nF and is difficult to be integrated on a semiconductor substrate, so that the gate drive buffer circuit may be connected in a DC manner to the gate of the MOSFET to drive the MOSFET, thereby eliminating the need for the AC coupling capacitor (refer to, JP-A-2008-252436, for example).

The pulse generating circuit portion 20 in FIG. 1A is the P-channel analog switch and has a function to generate a pulse of the positive voltage VPP2 as illustrated in the timing chart in FIG. 1B.

The operation of the pulse generating circuit portion 20 in FIG. 1A is described below with reference to FIG. 4. VA and OUT in FIG. 4 correspond to VPP2 and OUT in FIG. 1A respectively. PSW1 and PSW2 in FIG. 4 correspond to the P-channel high withstand voltage MOSFETs 21 and 22 in FIG. 1A respectively.

Figure 4:
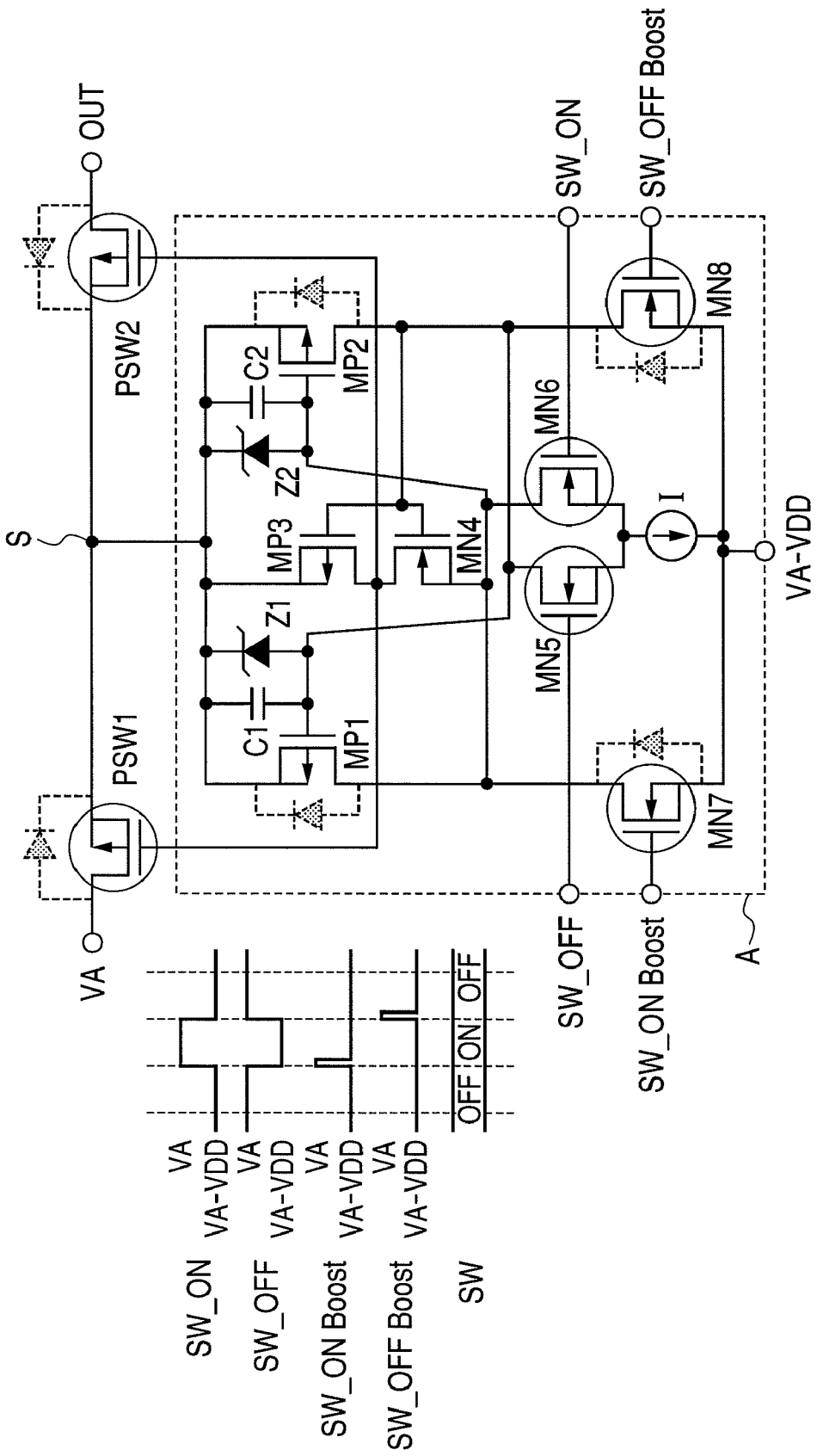
FIG. 4 is a circuit diagram and a timing chart of a gate control circuit in a P-channel analog switch according to the present invention.
Figure 5:
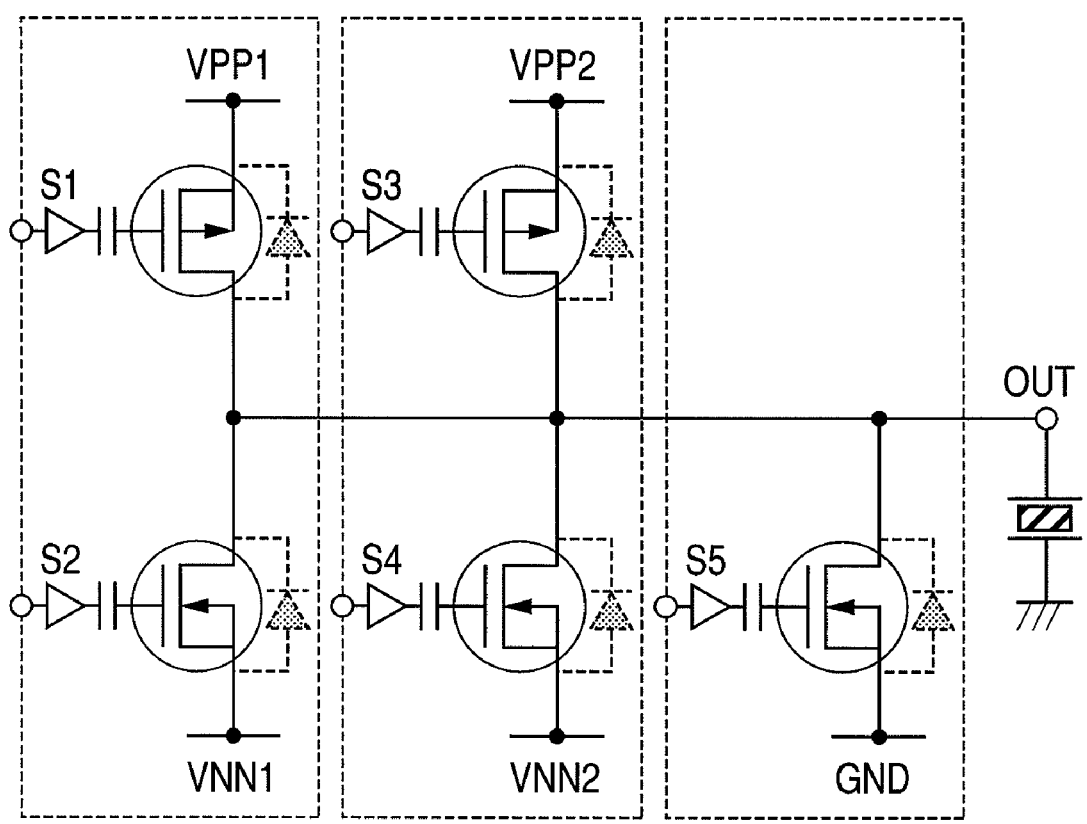
FIG. 5 is a circuit diagram showing a modification of a conventional transmitter circuit based on the unique viewpoint of the inventors prior to the present invention.
Figure 6A:
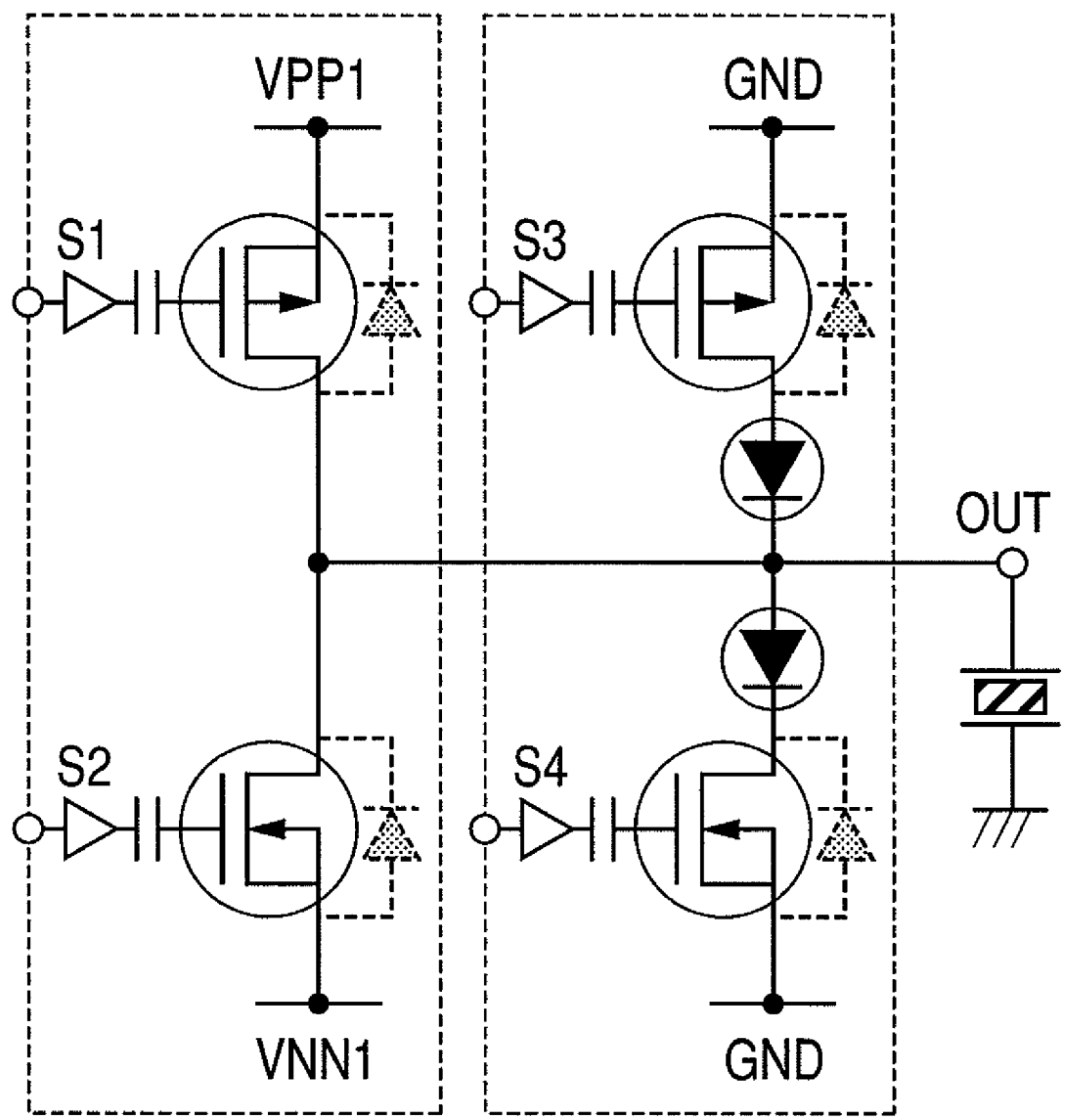
FIG. 6A is a circuit diagram showing a modification of a conventional transmitter circuit based on the unique viewpoint of the inventors prior to the present invention.
Figure 6B:
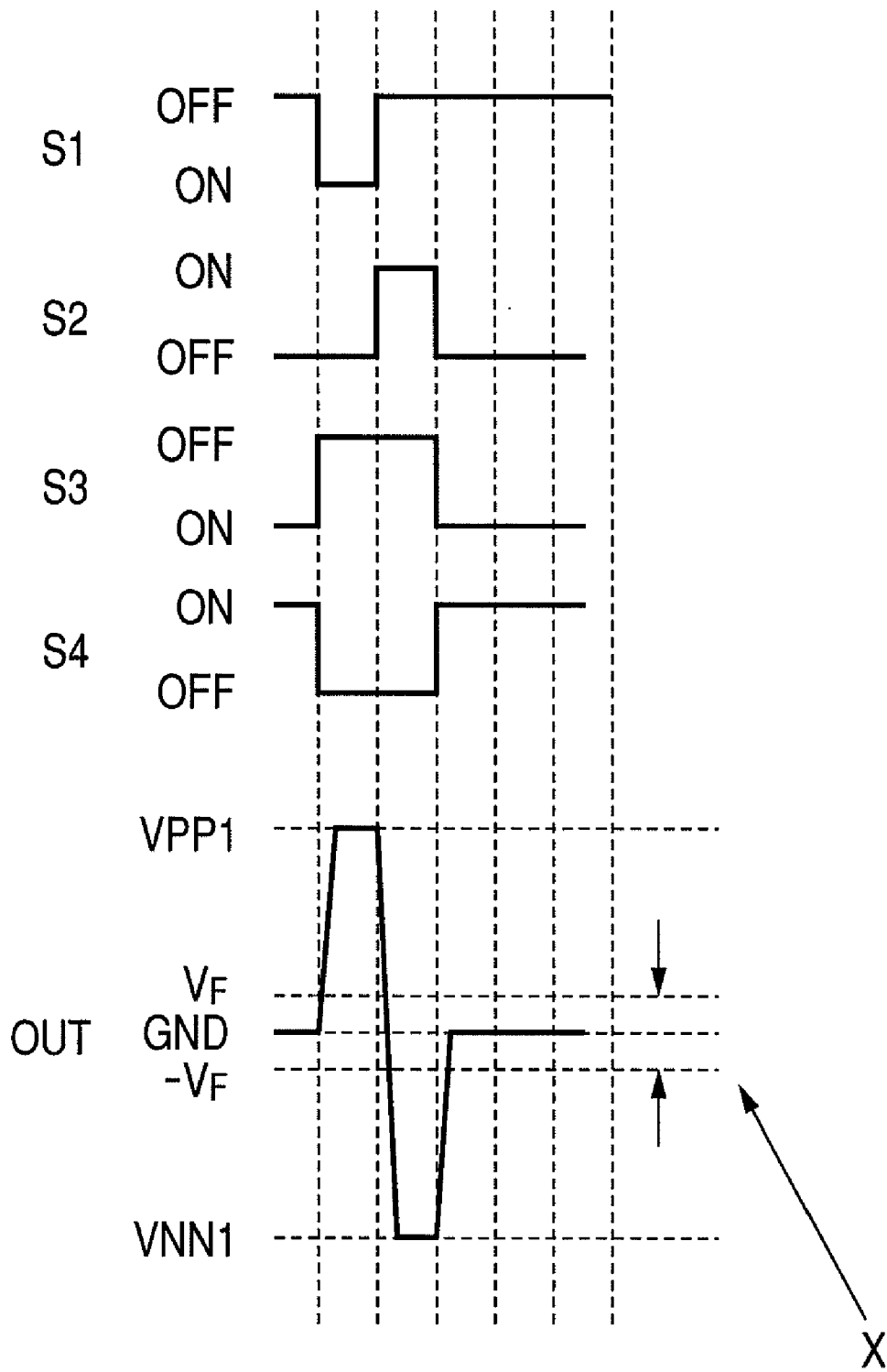
FIG. 6B is a timing chart for operating the transmitter circuit in FIG. 6A.
Figure 7A:
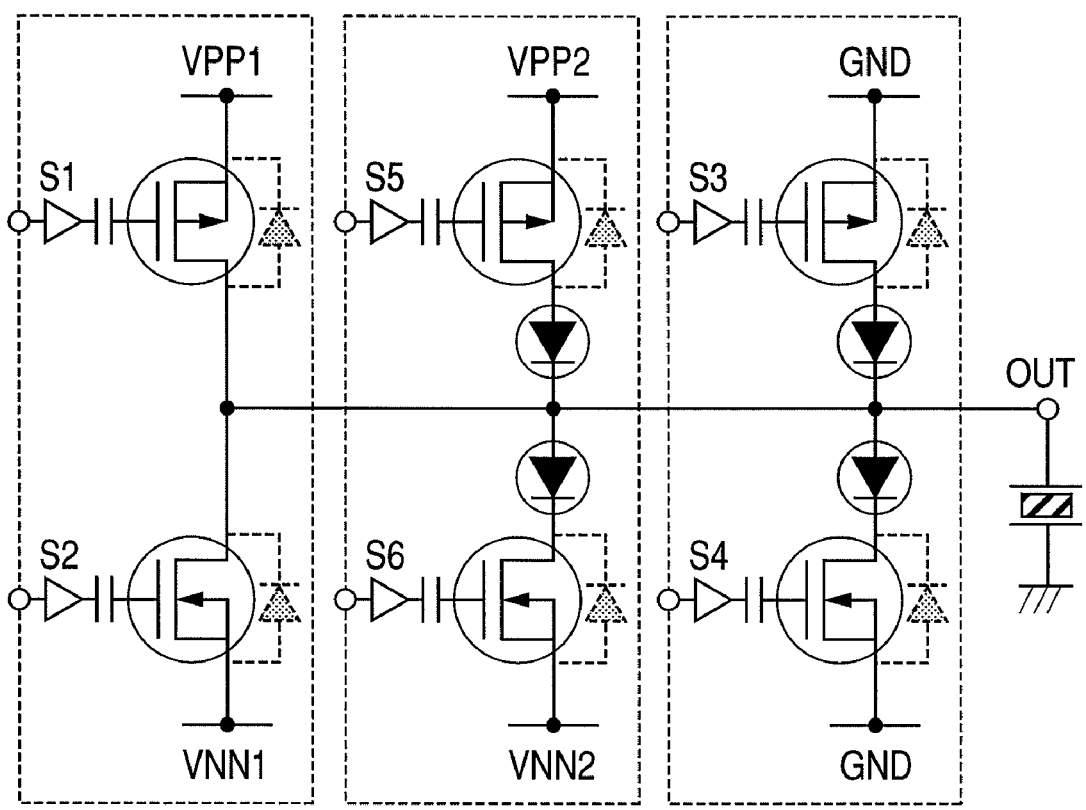
FIG. 7A is a circuit diagram showing a modification of a conventional transmitter circuit based on the unique viewpoint of the inventors prior to the present invention.
Figure 7B:
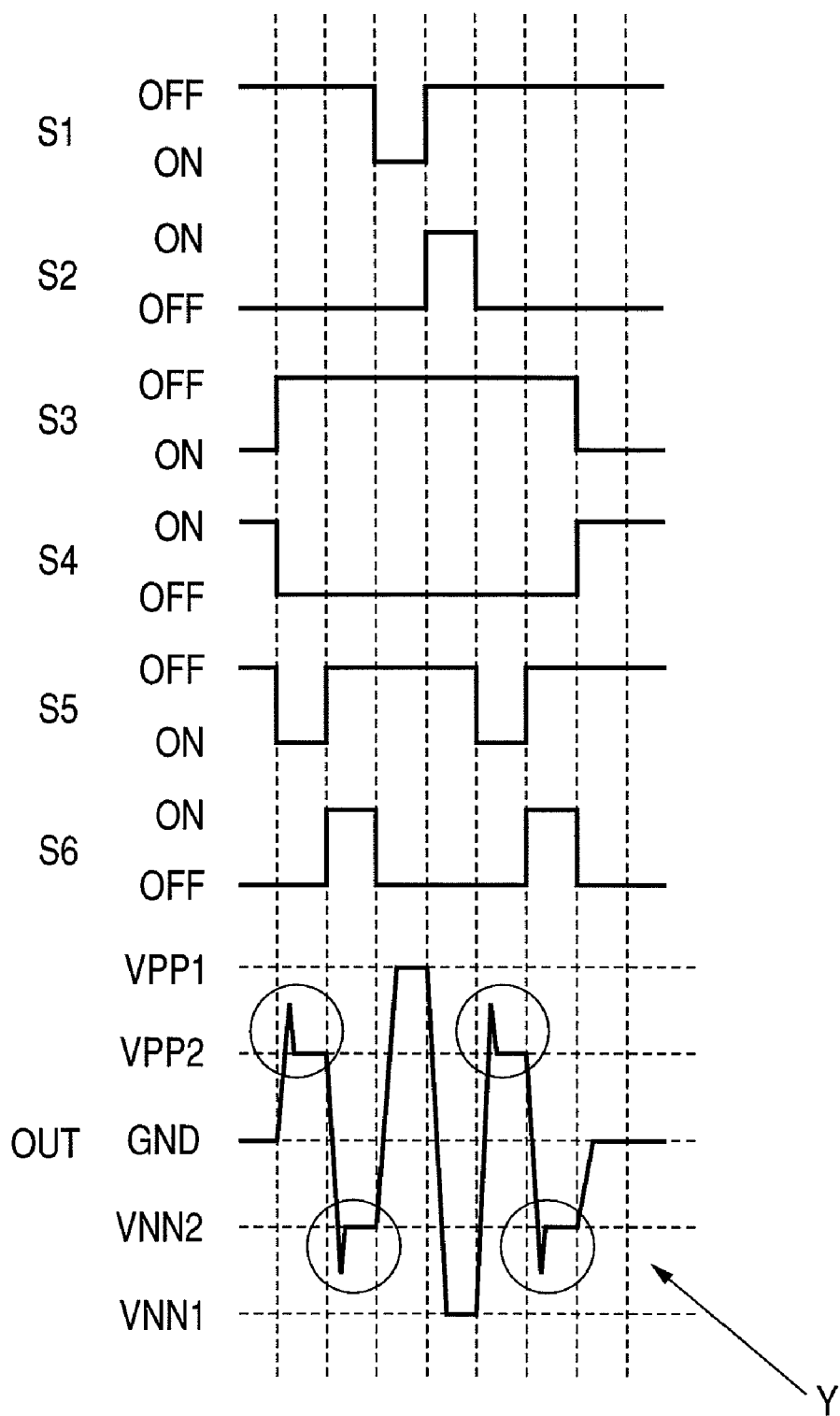
FIG. 7B is a timing chart for operating the transmitter circuit in FIG. 7A.

A portion A in FIG. 4 corresponds to the floating voltage low-withstand voltage gate-driving circuit portion 23 in FIG. 1A and shows one example of a configuration of a floating voltage low-withstand voltage gate-driving circuit for driving the PSW1 and PSW2. The portion A is fundamentally a latch circuit. The high voltage side of a supply rail on the circuit is connected to the source in a floating state between SWs and the low voltage side of the supply rail is biased to VA−VDD. VPP2 is applied to VA described above and a voltage of approximately five volts is used as VDD.

The gates of PSW1 and PSW2 are common, so that the PSW1 and PSW2 are simultaneously turned on or off. A terminal SW_ON is rendered a level H and a terminal SW_OFF is rendered a level L to turn on an SW. At this point, an M6 is turned on to produce a current path to a current source I in a zener diode Z2 connected between the gate and the source of an M2, producing a zener voltage of approximately five volts across the zener diode Z2 and charging a capacitor C2 to turn on the M2. At the same time, a level-H pulse of approximately several tens nanoseconds is applied to an SW_ON Boost terminal to turn on an M7, thereby enabling improvement of operation speed at the time of turning on the M2, which is particularly suited for a transmission pulser for a medical ultrasound system. A level-H pulse is applied to the input of an inverter formed of an M3 and an M4 and a level-L pulse being the output thereof is applied to the gate of the SW to turn on the SW, applying the voltage VPP2 supplied to a VA terminal to the output terminal OUT.

The terminal SW_ON is rendered a level L and the terminal SW_OFF is rendered a level H to turn off the SW. At this point, an M5 is turned on to produce a current path to the current source I in a zener diode Z1 connected between the gate and the source of an M1, producing a zener voltage of approximately five volts across the zener diode Z1 and charging a capacitor C1 to turn on the M1. At the same time, a level-H pulse of approximately several tens nanoseconds is applied to an SW_OFF Boost terminal to turn on an M8, thereby enabling improvement of operation speed at the time of turning on the M1. The source of an M4 is equal in potential to a node S to turn off the SW.

When the SW is in a turn-off state, the electric potential of the output terminal OUT is determined by a bias voltage from other circuits connected to the output terminal OUT. As illustrated in FIG. 1B, the bias voltage ranges from the lowest potential VNN1 to the highest potential VPP1. In FIG. 4, when the electric potential of the output terminal OUT is lower than an electric potential VA at the other end, the electric potential of the node S is equal to VA−VF, which causes the body diode of an SW2 to perform a withstand-voltage protection. When the electric potential of the output terminal OUT is higher than the electric potential VA at the other end, the electric potential of the node S is equal to OUT−VF, which causes the N-channel high withstand voltage MOSFETs M5, M6, M7, and M8 to perform a withstand-voltage protection for the upper low-withstand voltage elements.

The pulse generating circuit portion 30 in FIG. 1A is the N-channel analog switch and has a function to generate a pulse of the negative voltage VNN2 as illustrated in the timing chart.

The operation of the pulse generating circuit portion 30 in FIG. 1A is described below with reference to FIG. 3. VA and OUT in FIG. 3 correspond to VNN2 and OUT in FIG. 1A respectively. NSW1 and NSW2 in FIG. 3 correspond to the N-channel high withstand voltage MOSFETs 32 and 31 in FIG. 1A respectively.

Figure 3:
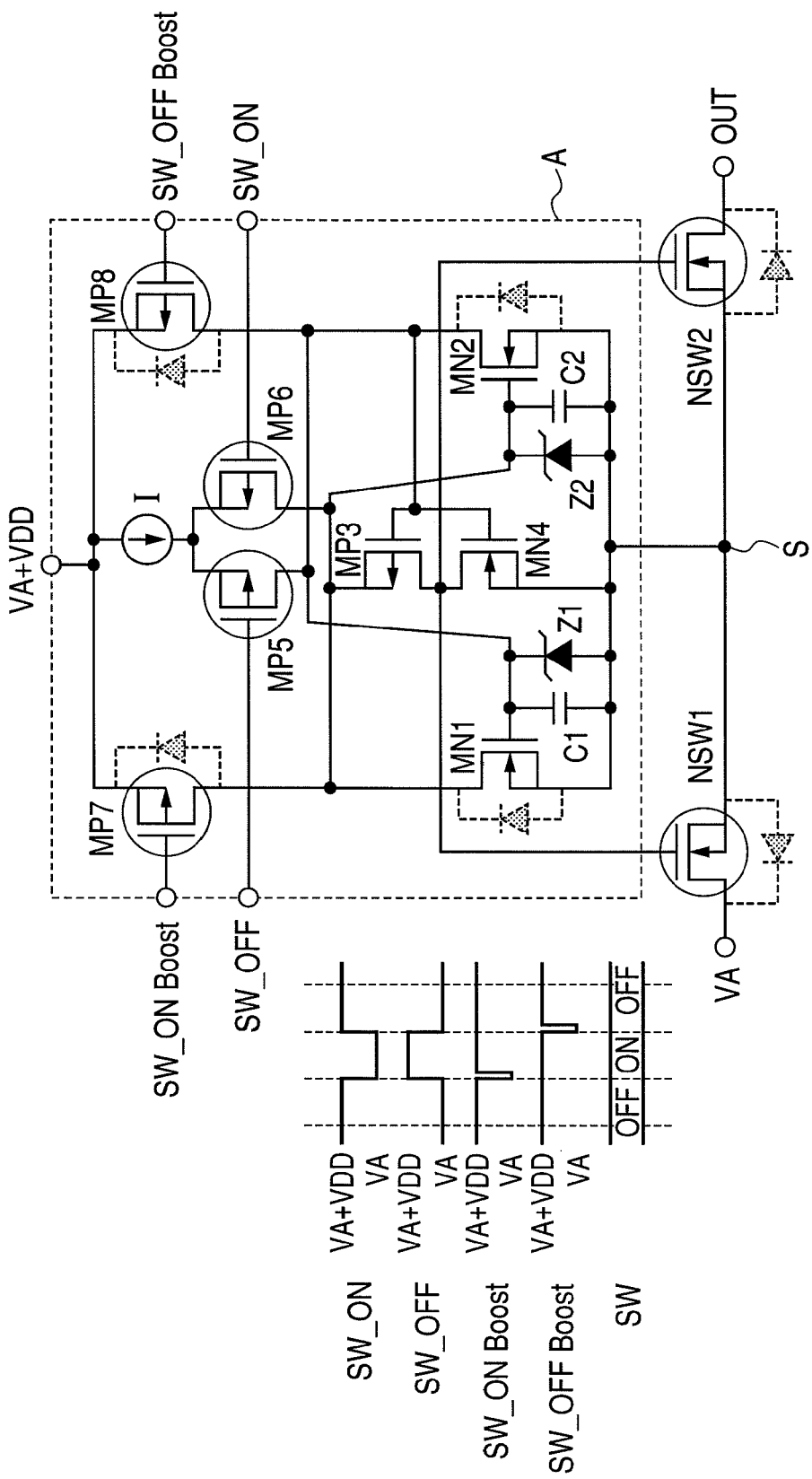
FIG. 3 is a circuit diagram and a timing chart of a gate control circuit in an N-channel analog switch according to the present invention.

A portion A in FIG. 3 corresponds to the floating voltage low-withstand voltage gate-driving circuit portion 33 in FIG. 1A and shows one example of a configuration of a floating voltage low-withstand voltage gate-driving circuit for driving the NSW1 and NSW2. The floating voltage low-withstand voltage gate-driving circuit is opposite in configuration to the floating voltage low-withstand voltage gate-driving circuit illustrated in FIG. 4. The portion A is fundamentally a latch circuit. The high voltage side of a supply rail on the circuit is biased to VA+VDD and the low voltage side of the supply rail is connected to the source in a floating state between SWs. VNN2 is applied to VA described above, and a voltage of approximately five volts is used as VDD.

The gates of NSW1 and NSW2 are common, so that the NSW1 and NSW2 are simultaneously turned on or off. The terminal SW_ON is rendered a level L and the terminal SW_OFF is rendered a level H to turn on the SW. At this point, an M6 is turned on to produce a current path to the current source I in the zener diode Z2 connected between the gate and the source of an M2, producing a zener voltage of approximately five volts across the zener diode Z2 and charging the capacitor C2 to turn on the M2. At the same time, a level-L pulse of approximately several tens nanoseconds is applied to the SW_ON Boost terminal to turn on an M7, thereby enabling improvement of operation speed at the time of turning on the M2. A level-L pulse is applied to the input of an inverter formed of an M3 and an M4 and a level-H pulse being the output thereof is applied to the gate of the SW to turn on the SW, applying the voltage VNN2 supplied to a VA terminal to the output terminal OUT.

The terminal SW_ON is rendered a level H and the terminal SW_OFF is rendered a level L to turn off the SW. At this point, an M5 is turned on to produce a current path to the current source I in a zener diode Z1 connected between the gate and the source of an M1, producing a zener voltage of approximately five volts across the zener diode Z1 and charging a capacitor C1 to turn on the M1. At the same time, a level-L pulse of approximately several tens nanoseconds is applied to an SW_OFF Boost terminal to turn on an M8, thereby enabling improvement of operation speed at the time of turning on the M1. The source of an M3 is equal in potential to a node S to turn off the SW.

When the SW is in a turn-off state, the electric potential of the output terminal OUT is determined by a bias voltage from other circuits connected to the output terminal OUT. As illustrated in FIG. 1B, the bias voltage ranges from the lowest potential VNN1 to the highest potential VPP1. In FIG. 3, when the electric potential of the output terminal OUT is higher than an electric potential VA at the other end, the electric potential of the node S is equal to VA+VF, which causes the body diode of an SW2 to perform a withstand-voltage protection. When the electric potential of the output terminal OUT is lower than the electric potential VA at the other end, the electric potential of the node S is equal to OUT+VF, which causes the P-channel high withstand voltage MOSFETs M5, M6, M7, and M8 to perform a withstand-voltage protection of the lower low-withstand voltage elements.

The GND level damping circuit portion 40 in FIG. 1A is the N-channel analog switch and has a function to quickly return the electric potential of the output terminal OUT to the level GND at the time of turning on as illustrated in the timing chart.

The operation of the GND level damping circuit portion 40 in FIG. 1A is described below with reference to FIG. 3. VA and OUT in FIG. 3 correspond to GND and OUT in FIG. 1A respectively. NSW1 and NSW2 in FIG. 3 correspond to the N-channel high withstand voltage MOSFETs 42 and 41 in FIG. 1A respectively.

The portion A in FIG. 3 corresponds to the floating voltage low-withstand voltage gate-driving circuit portion 43 in FIG. 1A and shows one example of a configuration of a floating voltage low-withstand voltage gate-driving circuit for driving the NSW1 and NSW2. As described above, the GND level damping circuit portion 40 is similar in operational principle to the pulse generating circuit portion 30. Therefore, the operational principle of the floating voltage low-withstand voltage gate-driving circuit portion 43 can be described as that of the portion A in FIG. 3 as is the case with the operational principle of the floating voltage low-withstand voltage gate-driving circuit portion 33.

According to the present embodiment, the transmitter circuit configured to generate ultrasound voltage pulses with a frequency of approximately several MHz and plural voltage levels of approximately 0 V to ±100 V and suited for a medical ultrasound system can be realized by a semiconductor substrate smaller in area and in a larger scale by using plural analog switches in which the gate terminals of two high withstand voltage MOSFETs are connected to each other, the source terminals thereof are connected to each other, and the gate terminals thereof are driven by the floating voltage low-withstand voltage gate-driving circuit. For this reason, there is no dead zone where an output is rendered in a high impedance state, so that there can be obtained a good quality pulse waveform which is excellent in resistance to external noise such as crosstalk between channels and small in waveform overshoot.

Second Embodiment

Figure 9:
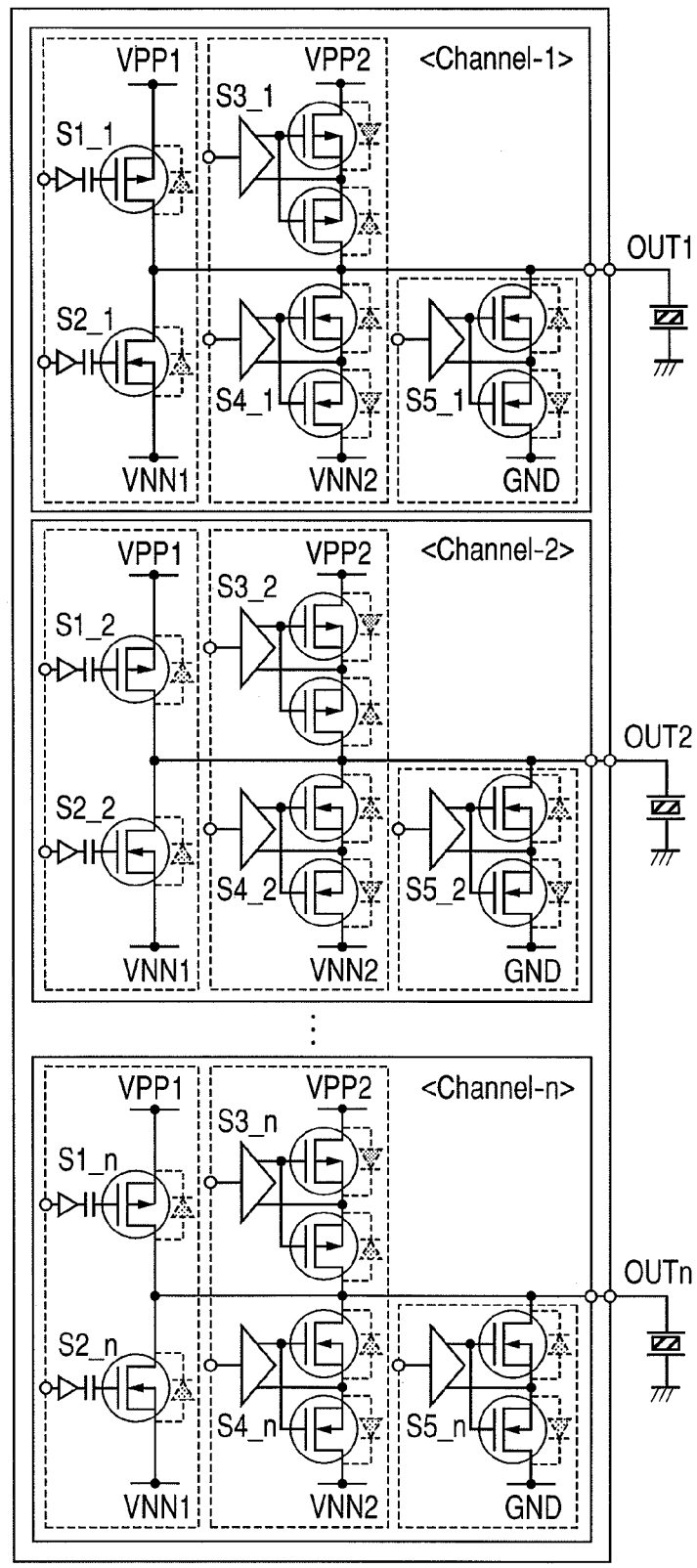
FIG. 9 is a circuit diagram of a semiconductor integrated circuit device in which a voltage pulse generating circuit made up of plural channels according to the present invention is integrally formed on a common semiconductor substrate as a transmitter circuit for a medical ultrasound system.

FIG. 9 is a circuit diagram of an embodiment of a semiconductor integrated circuit device in which a voltage pulse generating circuit including plural channels is integrally (monolithically) formed on a common semiconductor substrate such as single crystal silicon with the voltage pulse generating circuit as a unit channel. The voltage pulse generating circuit is configured such that the outputs OUT1 to OUTn (where, n is an integer of two or more) of the unit channels are connected to n transducers respectively to drive the n transducers on a channel basis.

The voltage pulse generating circuit of each channel is configured such that plural different positive voltages VPP1 to VPPk (where, k is an integer of two or more), plural different negative voltages VNN1 to VNNm (where, m is an integer of two or more), and ground voltage GND are connected to one terminal of plural semiconductor switching elements respectively and the other terminal thereof is commonly connected to the output terminal OUTi (where, i is an integer of 1 or more and n or less). The voltage pulse generating circuit of each channel generates a voltage pulse signal having a waveform pattern in which plural positive and negative electric potentials including ground potential GND is combined based on the control pulse signals input to the control terminals S1_i to Ss_i (where, s is the number of the switching elements and s of each channel is five, for example, in FIG. 9) of plural semiconductor switching elements and outputs the voltage pulse signal to the output terminal (OUTi). There is integrally formed n voltage pulse generating circuits each having a channel i on a common semiconductor substrate (where, n is the number of channels). The plural the voltage pulse generating circuits functions as the transmitter circuits for medical ultrasound system which drive ultrasound transducers and are formed of plural channels in which each of the voltage pulse generating circuits corresponds to a channel i of one unit.

Figure 8A:
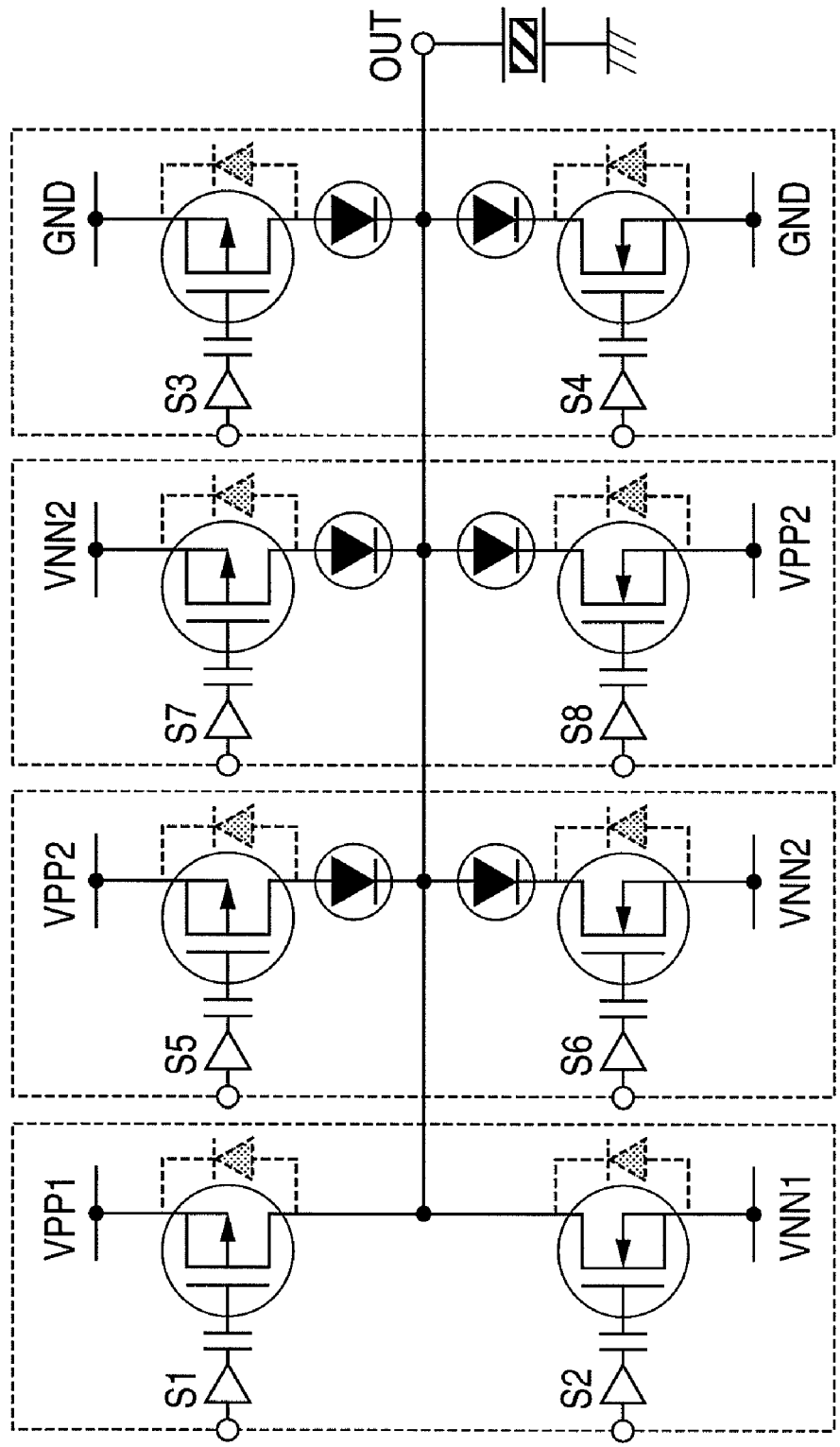
FIG. 8A is a circuit diagram showing a modification of a conventional transmitter circuit based on the unique viewpoint of the inventors prior to the present invention.
Figure 8B:
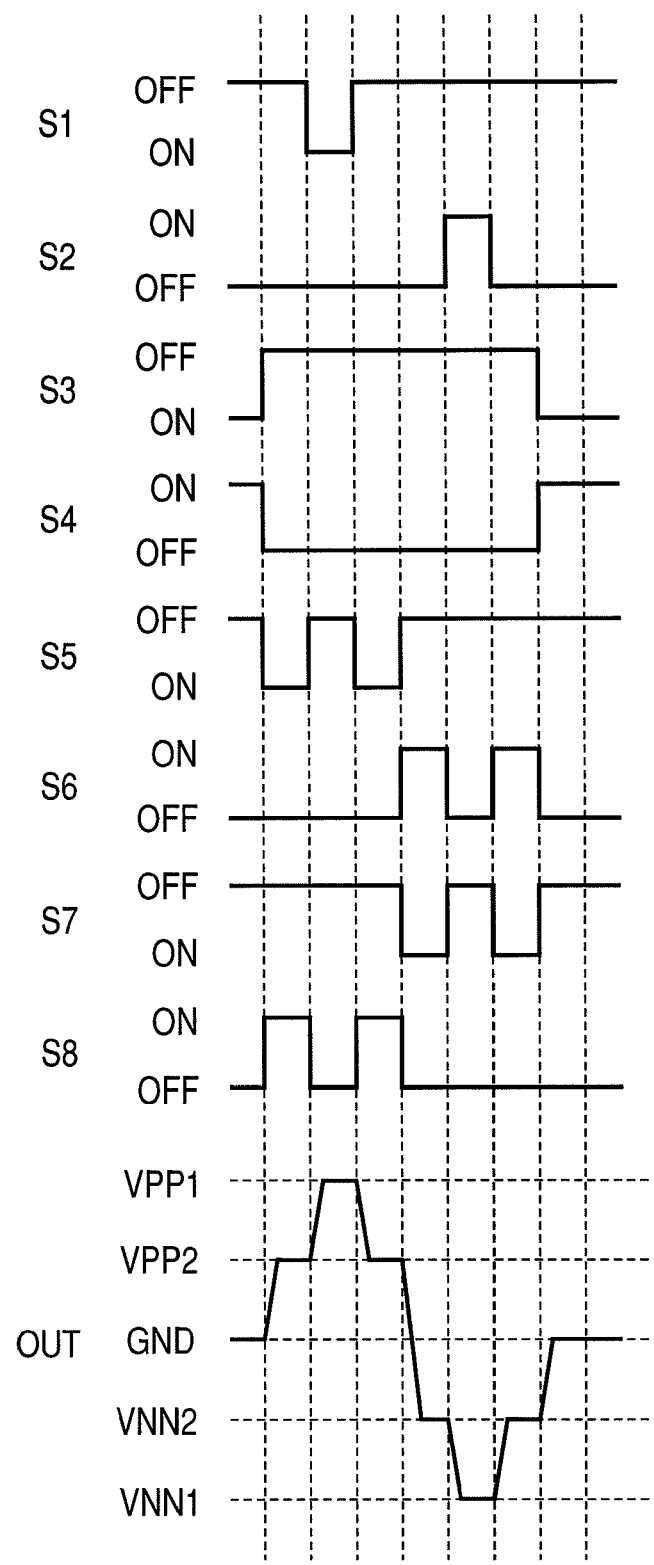
FIG. 8B is a timing chart for operating the transmitter circuit in FIG. 8A.

As described above, the unit channel can be formed by fewer semiconductor devices than a conventional unit channel illustrated in FIG. 8A. That is to say, there is produced an effect that the number of the semiconductor devices can be reduced in each of the voltage pulse generating circuits with plural channels. Therefore, the effect of reducing a circuit area is more pronounced in the voltage pulse generating circuits with plural channels illustrated in FIG. 9.

According to the present embodiment, it is enabled to realize the voltage pulse generating circuit which has plural positive and negative electric potentials including ground potential and is excellent in resistance to external noise such as crosstalk between channels because there is no dead zone where an output is rendered in a high impedance state and small in waveform overshoot using a smaller number of semiconductor devices. The transmitter circuit which is good in waveform quality and suited for a medical ultrasound system can be realized by a monolithic IC illustrated in FIG. 9 in which plural channels is formed on a single semiconductor substrate such as single crystal silicon with the circuit illustrated in FIG. 1A as a unit channel.

Figure 2:
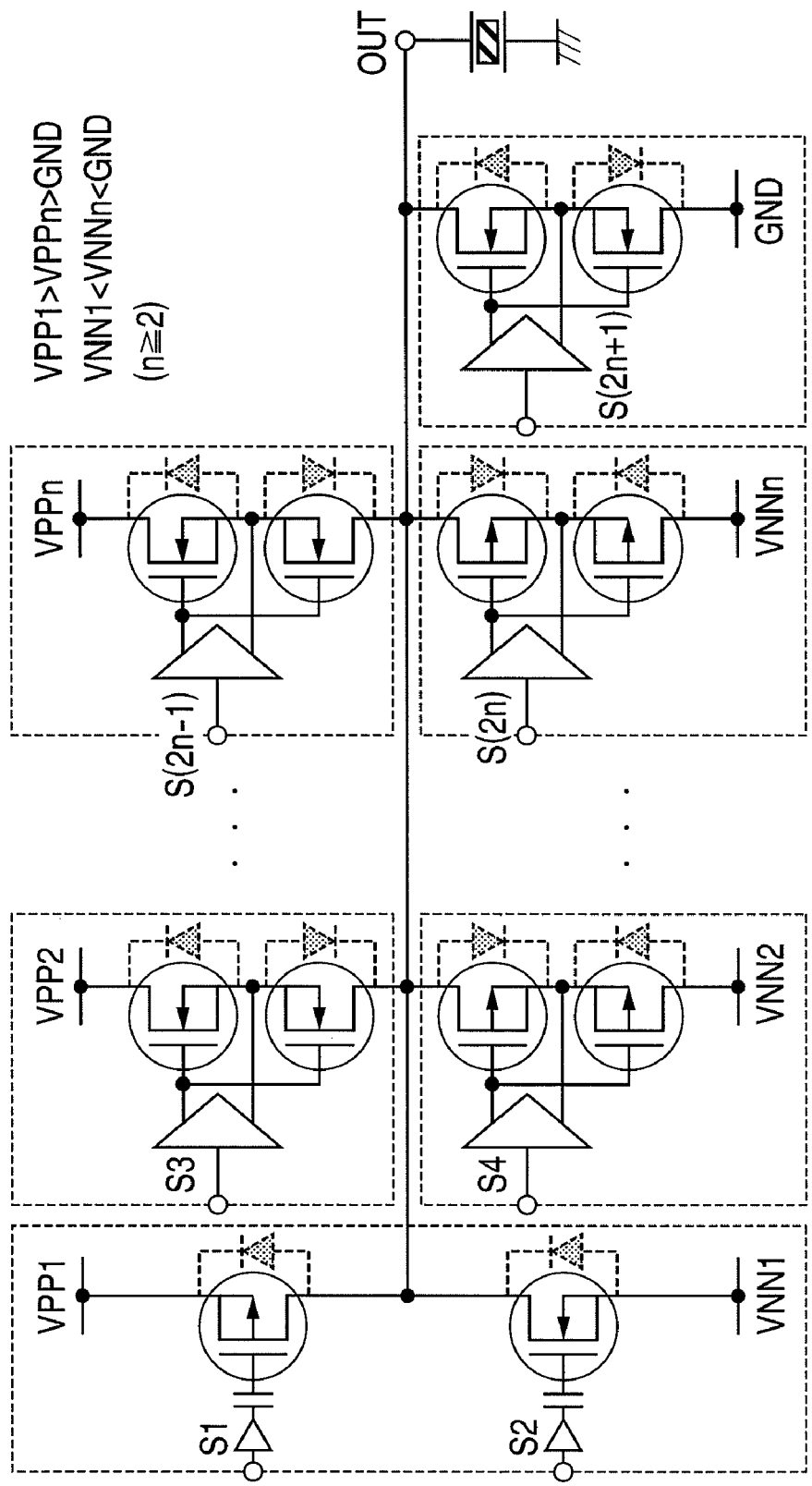
FIG. 2 is a circuit diagram illustrating a modification of the voltage pulse generating circuit according to the present invention.

In FIG. 1A, although the present embodiment is configured by using the P-channel analog switch in the pulse generating circuit portion 20 and the N-channel analog switch in the pulse generating circuit portion 30 and the GND level damping circuit portion 40, each circuit may use any of the P-channel analog switch or the N-channel analog switch as illustrated in FIG. 2.

The present embodiment can be realized by using only analog switch by replacing the pulse generating circuit portions 10 in FIG. 1A with the P-channel or N-channel analog switches.

Furthermore, the present embodiment can be realized by a configuration with (2 n+1) levels in which a ground potential is added to n positive and negative potentials.

What is claimed is:
1. A semiconductor integrated circuit device in which pulse generating circuits are formed on a semiconductor substrate, each of the pulse generating circuits being configured to receive a plurality of different positive and negative electric potentials at respective first terminals of a plurality of semiconductor switching elements, with second terminals of the plurality of semiconductor switching elements being commonly connected to an output terminal,
  wherein each pulse generating circuit is operative to generate voltage pulse signals at each of said plurality of positive and negative electric potentials and at a ground potential based on control pulse signals input to corresponding control terminals of the plurality of semiconductor switching elements,
  wherein each of the plurality of semiconductor switching elements comprises a latch circuit and one of a P-channel analog switching circuit and an N-channel analog switching circuit,
  wherein each of said P-channel and N-channel analog switching circuits has first and second MOSFETs, source terminals of the first and second MOSFETs being commonly connected to each other, gate terminals of the first and second MOSFETs being commonly connected to each other, and a drain terminal of the first MOSFET being to receive a first potential that is any one of said plurality of different positive and negative potentials, and a drain terminal of the second MOSFET being connected to the output terminal, and
  wherein each of the latch circuits is operative to control a corresponding one of said P-channel or N-channel analog switching circuits based on a corresponding one of said control pulse signals, and has a reference potential terminal thereof connected to the commonly connected source terminals of the corresponding first and second MOSFETs.

2. The semiconductor integrated circuit device according to claim 1,
  wherein each said latch circuit is operative to apply a gate control signal to the commonly connected gate terminals of the corresponding P-channel or N-channel analog switching circuit based on the control pulse signal from the corresponding control terminal,
  wherein, for each said N-channel analog switching circuit, the commonly connected source terminals of the first N-channel MOSFET and the second N-channel MOSFET are connected to a power supply on a low potential side of the corresponding latch circuit as a first floating voltage, and a third voltage, which is higher than the first floating voltage by a second voltage used as a low voltage power supply, is supplied as a power supply on a high potential side of the corresponding latch circuit.

3. The semiconductor integrated circuit device according to claim 2,
  wherein each latch circuit corresponding to one of said N-channel analog switching circuits is configured to receive the third voltage at source terminals of first and second P-channel MOSFETs of the latch circuit and further has:
  a drain terminal of a third N-channel MOSFET lower in withstand voltage than the first and second N-channel MOSFETs, a gate terminal of a fourth N-channel MOSFET lower in withstand voltage than the first and second N-channel MOSFETs, a drain terminal of a third P-channel MOSFET, and a high-potential side of a first inverter formed of a P-channel MOSFET lower in withstand voltage than the first, second, and third P-channel MOSFETs and an N-channel MOSFET lower in withstand voltage the first and second N-channel MOSFETs, commonly connected to the drain terminal of the third first P-channel MOSFET;
  the gate terminal of the third N-channel MOSFET, the drain terminal of the fourth N-channel MOSFET, a drain terminal of a fourth P-channel MOSFET, and an input terminal of the first inverter are commonly connected to the drain terminal of the second P-channel MOSFET;
  an output terminal of the first inverter has the gate terminals of the corresponding first and second N-channel MOSFETs commonly connected thereto;
  source terminals of the fourth P-channel MOSFET and a fifth P-channel MOSFET are commonly connected to the third voltage through a first current source;
  a first electrode of a first capacitor and a cathode of a first zener diode are commonly connected to the gate terminal of the third N-channel MOSFET;
  a second electrode of the first capacitor and an anode of the first zener diode are commonly connected to the source terminal of the third N-channel MOSFET;
  a first electrode of a second capacitor and a cathode of a second zener diode are commonly connected to the gate terminal of the fourth N-channel MOSFET; and
  a second electrode of the second capacitor and an anode of the second zener diode are commonly connected to the source terminal of the fourth N-channel MOSFET.

4. The semiconductor integrated circuit device according to claim 1,
  wherein each said latch circuit is operative to apply a gate control signal to the commonly connected gate terminals of the corresponding P-channel or N-channel analog switching circuit based on the control pulse signal from the corresponding control terminal,
  wherein, for each said P-channel analog switching circuit, the commonly connected source terminals of the first and second P-channel MOSFETs are connected to a power supply on a high potential side of the corresponding latch circuit as a second floating voltage, and fourth voltage, which is lower than the second floating voltage by a second voltage used as a low voltage power supply, is supplied as a power supply on a low potential side of the corresponding latch circuit.

5. The semiconductor integrated circuit device according to claim 4,
  wherein each latch circuit corresponding to one of said P-channel analog switching circuits is configured to receive the fourth voltage at source terminals of first and second N-channel MOSFETs of the latch circuit and further has:
  a drain terminal of a third P-channel MOSFET lower in withstand voltage than the first and second P-channel MOSFETs, a gate terminal of a fourth P-channel MOSFET lower in withstand voltage than the first and second P-channel MOSFETs, a drain terminal of a third N-channel MOSFET, and a low potential side of a second inverter formed of an N-channel MOSFET lower in withstand voltage than the first, second, and third N-channel MOSFETs and a P-channel MOSFET lower in withstand voltage than the first and second P-channel MOSFETs, commonly connected to the drain terminal of the first N-channel MOSFET;
  the gate terminal of the third P-channel MOSFET, the drain terminal of the fourth P-channel MOSFET, a drain terminal of a fourth N-channel MOSFET, and an input terminal of a second inverter are commonly connected to the drain terminal of the second N-channel MOSFET;
  an output terminal of the second inverter has the gate terminals of the corresponding first and second P-channel MOSFETs commonly connected thereto;

source terminals of the fourth N-channel MOSFET and a fifth N-channel MOSFET are commonly connected to the fourth voltage through a second current source;

a first electrode of a third capacitor and an anode of a third zener diode are commonly connected to the gate terminal of the third P-channel MOSFET;

a second electrode of the third capacitor and a cathode of the third zener diode are commonly connected to the source terminal of the third P-channel MOSFET;

a first electrode of a fourth capacitor and an anode of a fourth zener diode are commonly connected to the gate terminal of the fourth P-channel MOSFET; and a second electrode of the fourth capacitor and a cathode of the fourth zener diode are commonly connected to the source terminal of the fourth P-channel MOSFET.

6. A semiconductor integrated circuit device in which a plurality of pulse generating circuits is formed on a common semiconductor substrate, each of the pulse generating circuits being configured to receive a plurality of different positive and negative electric potentials at respective first terminals of a plurality of semiconductor switching elements, with second terminals of the plurality of semiconductor switching elements being commonly connected to each other as an output terminal, wherein each of the pulse generating circuits is operative to generate voltage pulse signals at each of said plurality of positive and negative electric potentials and at a ground potential based on control pulse signals input to corresponding control terminals of the plurality of semiconductor switching elements, wherein each of the plurality of semiconductor switching elements comprises a latch circuit and one of a P-channel analog switching circuit and an N-channel analog switching circuit, wherein each of said P-channel and N-channel analog switching circuits has first and second MOSFETs, source terminals of the first and second MOSFETs being commonly connected to each other, gate terminals of the first and second MOSFETs being commonly connected to each other, and a drain terminal of the first MOSFET being to receive a first potential that is any one of said plurality of different positive and negative potentials, and a drain terminal of the second MOSFET being connected to the output terminal, wherein each of the latch circuits is operative to control a corresponding one of said P-channel or N-channel analog switching circuits based on a corresponding one of said control pulse signals, and has a reference potential terminal thereof connected to the commonly connected source terminals of the corresponding first and second MOSFETs, and wherein the plurality of the voltage pulse generating circuits are operative as a plurality of transmitter circuit channels for a medical ultrasound system to drive corresponding ultrasound transducers.

7. The semiconductor integrated circuit device according to claim 6, wherein each said latch circuit is operative to apply a gate control signal to the commonly connected gate terminals of the corresponding N-channel or P-channel analog switching circuit based on the control signal input from the corresponding control terminal, wherein, for each said N-channel analog switching circuit, the commonly connected source terminals of the first N-channel MOSFET and the second N-channel MOSFET are connected to a power supply on a low potential side of the corresponding latch circuit as a first floating voltage, and a third voltage, which is higher than the first floating voltage by a second voltage used as a low voltage power supply, is supplied as a power supply on a high potential side of the corresponding latch circuit.

8. The semiconductor integrated circuit device according to claim 7, wherein each latch circuit corresponding to one of said N-channel analog switching circuits is configured to receive the third voltage at source terminals of the first and second P-channel MOSFETs of the latch circuit, and further has:

a drain terminal of a third N-channel MOSFET lower in withstand voltage than the first and second N-channel MOSFETs, a gate terminal of a fourth N-channel MOSFET lower in withstand voltage than the first and second N-channel MOSFETs, the drain terminal of a third P-channel MOSFET, and a high-potential side of a first inverter formed of a P-channel MOSFET lower in withstand voltage than the first, second, and third P-channel MOSFETs and an N-channel MOSFET lower in withstand voltage than the first and second N-channel MOSFETs, commonly connected to the drain terminal of the first P-channel MOSFET;

the gate terminal of the third N-channel MOSFET, the drain terminal of the fourth N-channel MOSFET, a drain terminal of a fourth P-channel MOSFET, and an input terminal of the first inverter are commonly connected to the drain terminal of the second P-channel MOSFET;

an output terminal of the first inverter has the gate terminals of the corresponding first and second N-channel MOSFETs commonly connected thereto;

source terminals of the fourth P-channel MOSFET and a fifth P-channel MOSFET are commonly connected to the third voltage through a first current source;

a first electrode of a first capacitor and a cathode of a first zener diode are commonly connected to the gate terminal of the third N-channel MOSFET;

a second electrode of the first capacitor and an anode of the first zener diode are commonly connected to the source terminal of the third N-channel MOSFET;

a first electrode of a second capacitor and a cathode of a second zener diode are commonly connected to the gate terminal of the fourth N-channel MOSFET; and a second electrode of the second capacitor and an anode of the second zener diode are commonly connected to the source terminal of the fourth N-channel MOSFET.

9. The semiconductor integrated circuit device according to claim 6, wherein each said latch circuit is operative to apply a gate control signal to the commonly connected gate terminals of the corresponding P-channel or N-channel analog switching circuit based on the control pulse signal from the corresponding control terminal, wherein, for each said P-channel analog switching circuit, the commonly connected source terminals of the first and second P-channel MOSFETs are connected to a power supply on a high potential side of the corresponding latch circuit as a second floating voltage, and fourth voltage, which is lower than the second floating voltage by a second voltage used as a low voltage power supply, is supplied as a power supply on a low potential side of the corresponding latch circuit.

10. The semiconductor integrated circuit device according to claim 9, wherein each latch circuit corresponding to one of said P-channel analog switching circuits is configured to receive the fourth voltage at source terminals of the first and second N-channel MOSFETs of the latch circuit, and further has:

a drain terminal of a third P-channel MOSFET lower in withstand voltage than the first and second P-channel MOSFETs, a gate terminal of a fourth P-channel MOSFET lower in withstand voltage than the first and second P-channel MOSFETs, drain terminal of a third N-channel MOSFET, and a low potential side of a second inverter formed of an N-channel MOSFET lower in withstand voltage than the first, second, and third N-channel MOSFETs and a P-channel MOSFET lower in withstand voltage than the first and second P-channel MOSFETs, commonly connected to the drain terminal of the first N-channel MOSFET;

the gate terminal of the third P-channel MOSFET, the drain terminal of the fourth P-channel MOSFET, a drain terminal of a fourth N-channel MOSFET, and an input terminal of a second inverter are commonly connected to the drain terminal of the second N-channel MOSFET;

an output terminal of the second inverter has the gate terminals of the corresponding first and second P-channel MOSFETs commonly connected thereto;

source terminals of the fourth N-channel MOSFET and a fifth N-channel MOSFET are commonly connected to the fourth voltage through a second current source;

a first electrode of a third capacitor and an anode of a third zener diode are commonly connected to the gate terminal of the third P-channel MOSFET;

a second electrode of the third capacitor and a cathode of the third zener diode are commonly connected to the source terminal of the third P-channel MOSFET;

a first electrode of a fourth capacitor and an anode of a fourth zener diode are commonly connected to the gate terminal of the fourth P-channel MOSFET; and a second electrode of the fourth capacitor and a cathode of the fourth zener diode are commonly connected to the source terminal of the fourth P-channel MOSFET.

\* \* \* \* \*